United States Patent
Cheung et al.

(10) Patent No.: US 12,013,568 B2
(45) Date of Patent: Jun. 18, 2024

(54) HYBRID METAL OXIDE SEMICONDUCTOR CAPACITOR WITH ENHANCED PHASE TUNING

(71) Applicant: HEWLETT PACKARD ENTERPRISE DEVELOPMENT LP, Houston, TX (US)

(72) Inventors: Stanley Cheung, Milpitas, CA (US); Yuan Yuan, Milpitas, CA (US); Di Liang, Santa Barbara, CA (US); Raymond G. Beausoleil, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 8 days.

(21) Appl. No.: 17/695,673

(22) Filed: Mar. 15, 2022

(65) Prior Publication Data
US 2023/0296831 A1   Sep. 21, 2023

(51) Int. Cl.
*G02B 6/12*      (2006.01)
*G02F 1/025*     (2006.01)
*H01S 5/026*     (2006.01)

(52) U.S. Cl.
CPC .......... *G02B 6/12004* (2013.01); *G02F 1/025* (2013.01); *H01S 5/026* (2013.01); *G02B 2006/12061* (2013.01)

(58) Field of Classification Search
CPC ...... G02B 6/12004; G02B 2006/12061; G02F 1/025; H01S 5/026
See application file for complete search history.

(56) References Cited

U.S. PATENT DOCUMENTS 6,603,889 B2   8/2003   Deliwala
6,608,945 B2   8/2003   Deliwala
(Continued)

FOREIGN PATENT DOCUMENTS

WO   2021/037853 A1   3/2021
WO   2021/037856 A1   3/2021

OTHER PUBLICATIONS

Chrostowski et al., Silicon Photonics Design: From Devices to Systems. Cambridge, Cambridge University Press, 2015, 3 pages.
(Continued)

*Primary Examiner* — Daniel Petkovsek
(74) *Attorney, Agent, or Firm* — Sheppard Mullin Richter & Hampton LLP

(57) ABSTRACT

Implementations disclosed herein provide for improving phase tuning efficiency of optical devices, such as a hybrid metal-on-semiconductor capacitor (MOSCAP) III-V/Si micro-ring laser. The present disclosure integrates silicon devices into a waveguide structural of the optical devices disclosed herein, for example, a waveguide resistor heater, a waveguide PIN diode, and waveguide PN diode. In some examples, the optical devices is a MOSCAP formed by a dielectric layer between two semiconductor layers, which provides for small phase tuning via plasma dispersion and/or carrier dispersion effect will occur depending on bias polarity. The plasma dispersion and/or carrier dispersion effect is enhanced according to implementations disclosed herein by heat, carrier injection, and/or additional plasma dispersion based on the silicon devices disclosed integrated into the waveguide.

14 Claims, 8 Drawing Sheets

(56) References Cited

U.S. PATENT DOCUMENTS

| | | |
|---|---|---|
| 6,625,348 B2 | 9/2003 | Deliwala |
| 6,690,844 B2 | 2/2004 | Deliwala |
| 6,748,125 B2 | 6/2004 | Deliwala |
| 6,947,615 B2 | 9/2005 | Deliwala |
| 6,963,118 B2 | 11/2005 | Deliwala et al. |
| 9,523,870 B2 * | 12/2016 | Wei .................... H01L 21/2253 |
| 9,612,503 B2 * | 4/2017 | Liang .................... G02F 1/2257 |
| 10,338,416 B2 * | 7/2019 | Liang .................... G02B 6/29341 |
| 10,585,243 B2 | 3/2020 | Bassett et al. |
| 10,901,246 B2 * | 1/2021 | Han .................... G02F 1/0516 |
| 2010/0215309 A1 * | 8/2010 | Shubin .................... G02F 1/01708 |
| | | 385/2 |

OTHER PUBLICATIONS

Liang et al., "Heterogeneous silicon light sources for datacom applications", Optical Fiber Technology, 2018, 10 pages.

Soref et al., "Electrooptical Effects in Silicon", IEEE Journal of Quantum Electronics, Jan. 1987, pp. 123-129.

* cited by examiner

HYBRID METAL OXIDE SEMICONDUCTOR CAPACITOR WITH ENHANCED PHASE TUNING

STATEMENT OF GOVERNMENT RIGHTS

This invention was made with Government support under Agreement Number H98230-18-3-0001. The Government has certain rights in the invention.

BACKGROUND

In optical transmitters, optical modulators are used to modulate optical carriers (light beams) with analog or digital signals for transmission through optical fibers. A typical wavelength division multiplexing-based optical transmitter uses several lasers each operating at a different wavelength to generate several different optical carriers. Each carrier passes through its own optical modulator where it is modulated with a signal to be transmitted. Then the modulated carriers are fed through an optical multiplexer into an optical fiber for transmission. An example silicon-based optical modulator design includes a metal oxide semiconductor (MOS) capacitor that adjoins a silicon optical waveguide. A signal applied across the capacitor induces an accumulation of charge near the center of the capacitor. This accumulation of charge modifies a refractive index of the optical waveguide as well as its propagation loss. Modifying the refractive index causes a phase shift in a beam of light propagating through the waveguide, thereby phase-modulating the light. When phase shift is utilized in optical waveguide components such as Mach-Zehnder interferometers (MZI), ring resonators, or Fabry-Perot (FP) resonators, the optical waveguide component transforms optical phase shift into optical power change to realize optical intensity modulation. When analog or constant optical power reduction is the purpose, instead of coding an electrical signal into an optical signal, the optical modulator can be used as an optical attenuator.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1A:
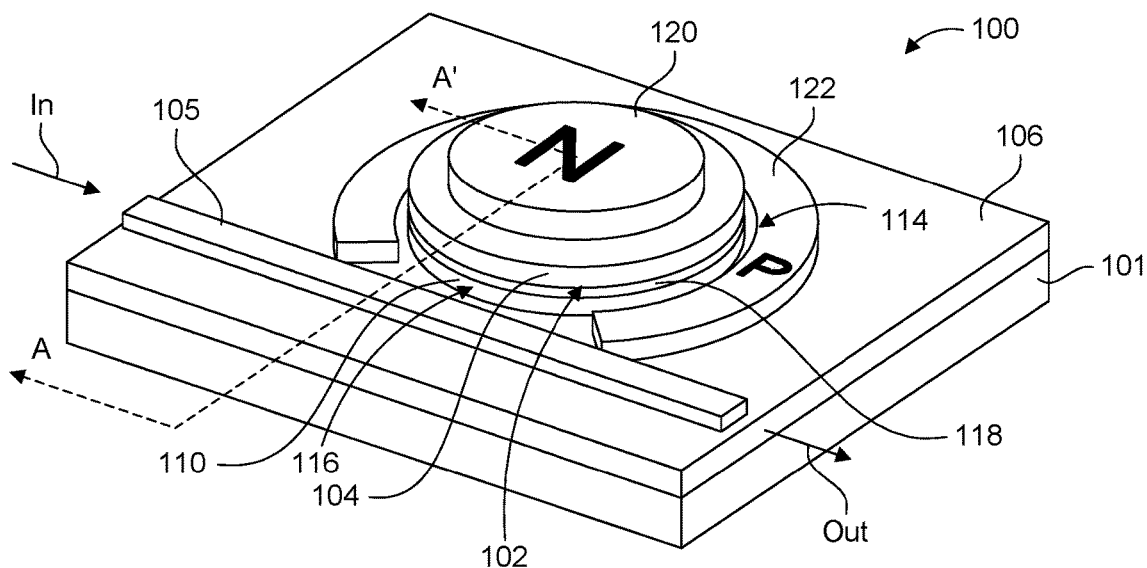
FIGS. 1A and 1B illustrate an example hybrid metal-oxide-semiconductor (MOS) ring-resonator optical modulator.

The figures are not exhaustive and do not limit the present disclosure to the precise form disclosed.

DETAILED DESCRIPTION

Various examples disclosed herein provide for optical modulators employing heterogeneous MOS capacitor (MOSCAP) adjoined to an optical waveguide. Charge accumulation and/or depletion may be induced within the MOSCAP by applying a bias. The accumulation and/or depletion modifies a refractive index of the optical waveguide and causes a phase shift in a beam of light propagating through the optical waveguide, thereby phase-modulating the beam of light. However, the phase shift induced in conventional MOSCAP designs phase is weak and inefficient. For example, the phase shift is weak because it is either based on carrier accumulation or carrier depletion, which means that the phase shift is dependent on presence or absence of carriers which can be weak.

Accordingly, examples herein provide enhanced phase shift properties, and thus improved efficiency in phase-modulation. For example, implementations herein provide for an optical device having a thin interfacial oxide (e.g., a dielectric material) sandwiched between two dissimilar semiconductors (e.g., a cathode and an anode), thereby forming a heterogeneous MOSCAP (referred to herein as a heterogeneous or hybrid MOSCAP). In various examples, the dissimilar semiconductors comprise a first semiconductor having a Group III-V material and a second semiconductor having a silicon, other Group IV material (e.g., germanium, silicon carbide, silicon germanium, and so on), or any semiconductor material capable of electrical conductivity and optical transparency. The two semiconductors may be formed in and on opposing sides an optical waveguide.

The depletion or accumulation of charges within the capacitor (e.g., within the optical waveguide) changes the local refractive index of the optical waveguide by changing the free carrier density. According to implementations disclosed herein, the effect is enhanced by integrating a semiconductor device (such as a resistor element, a PIN junction diode, or a PN junction diode) into the optical waveguide in combination with the MOSCAP. In some examples, the optical devices disclosed herein also integrate a light-emitting component into the optical device. The light-emitting component, such as a laser or other light-emitting diode, may be formed on the MOSCAP and adapted to generate light that can be injected into the optical waveguide. The injected light can then be phase shifted and modulated based on changes in local refractive index of the waveguide induced by charge accumulation and/or depletion within the MOSCAP.

Accordingly, the present disclosure provides for various configurations for improving the phase tuning efficiency of a hybrid MOSCAP micro-ring laser. The improved phase tuning efficiency results in wider wavelength shifts which may be used for direct high speed modulation and/or alignment to resonator based modulators. The MOSCAP structure itself, formed by a thin dielectric layer between two semiconductor layers, results in small phase tuning via plasma dispersion or carrier dispersion effect that occur depending on bias polarity. This phase tuning can be enhanced by heat, carrier injection, or additional plasma dispersion achieved by independently and simultaneously biasing the integrated silicon device implemented, for example, as one of a resistor element, a PN junction diode, and a PIN junction diode integrated into the optical waveguide.

Accordingly, implementations disclosed herein provide structures that improve phase shifter efficiency of current state-of-the-art micro-ring lasers and/or optical modulators. Additionally, implementations herein utilize a plurality of separate electrical contacts (also referred to herein as electrodes) that may be independently biased to achieve not only wider phase shift range but also more complex functionality for tuning capabilities, for example, through independent biasing of each electrical nodes.

The optical devices disclosed herein may enhance phase shifting and modulation utilized, for example, by Dense Wavelength Division Multiplexing (DWDM) photonic integration circuits (PIC) that implement a DWDM system, such as a transceiver. Dense Wavelength Division Multiplexing (DWDM) is an optical multiplexing technology used to increase bandwidth over existing fiber networks. The DWDM PIC architecture includes photonic devices fully integrating on a single manufacturing platform. Many optical devices on the PIC can be realized with higher performance and smaller footprint by using implementations disclosed herein that provide for improved efficiency in phase shifting and modulation.

It should be noted that the terms "optimize," "optimal", "improve", "enhance" and the like as used herein can be used to mean making or achieving performance as effective or perfect as possible. However, as one of ordinary skill in the art reading this document will recognize, perfection cannot always be achieved. Accordingly, these terms can also encompass making or achieving performance as good or effective as possible or practical under the given circumstances, or making or achieving performance better than that which can be achieved with other settings or parameters.

Figure 1B:
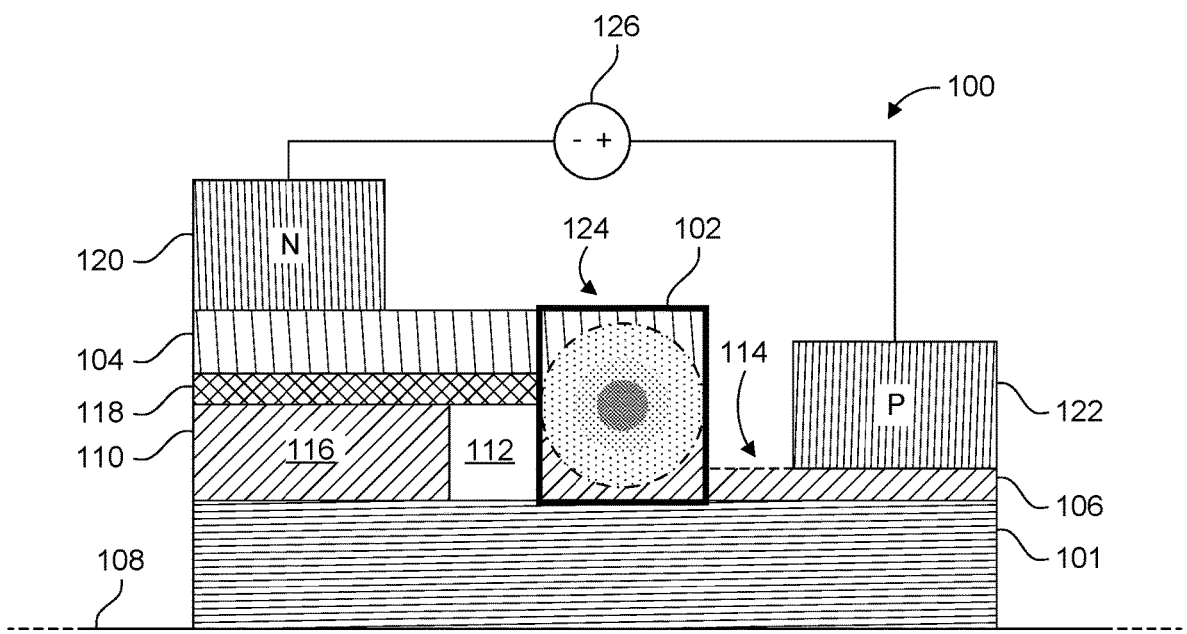

FIGS. 1A and 1B illustrate an example hybrid MOS ring-resonator optical modulator 100. FIG. 1A is a perspective view of the optical modulator 100 and FIG. 1B is a section view of the hybrid MOS optical modulator 100 taken along a line A-A' shown in FIG. 1A.

The optical modulator 100 includes an optical waveguide 102, a cathode 104 comprising a first material and formed in the optical waveguide 102, and an anode 106 comprising a second material that is different from the first material and formed in the optical waveguide 102. The anode adjoins the cathode. A capacitor is defined between the anode and the cathode.

In some examples, a substrate 101 comprises oxide grown on an underlying layer 108. A silicon layer 110 is formed on the substrate 101. A trench 112 separates the optical modulator 100 into two portions 114 and 116. The first portion 114 comprises the anode 106. The optical waveguide 102 is formed in the anode 106. The cathode 104 is integrated to the second portion 116. In various embodiments, the cathode 104 comprises a layer of Group III-V material as the first material. A MOS capacitor 124 is defined between the cathode 104 and the anode 106.

A dielectric 118 is formed between the cathode 104 and the anode 106. The dielectric 118 may be an electrically insulating material formed between the cathode 104 and anode 106 of the MOS capacitor 124, and the polarization of the dielectric 118 by an applied electric field may increase the surface charge of the MOS capacitor 224 for a given electric field strength. The dielectric 118 can be native oxides of the cathode or the anode or both, or can be external dielectric materials such as high-k dielectrics or polymers which can be formed by deposition, oxidation, wafer bonding or other dielectric coating methods.

The cathode 104 may comprise negatively-doped silicon and the anode 106 may comprise positively-doped silicon. A cathode electrode 120 is disposed on the cathode 104 and an anode electrode 122 is disposed on the anode 106. When a voltage is applied between the electrodes, carrier accumulation, depletion or inversion can occur around dielectric 118. Due to the capacitor region overlapping with the optical waveguide, carrier concentration change may lead to changes in waveguide modal refractive index and propagation loss. By biasing the voltage applied between the electrodes, the refractive index may be modulated accordingly, thereby inducing optical intensity modulation, phase shift modulation, and attenuation.

Light may be input into bus waveguide 105, a portion of which is tapped off into the optical waveguide 102 (e.g., at least a portion of light propagating in bus waveguide 104 is transferred into the optical waveguide 102). Light propagated through optical waveguide 102 is modulated, attenuated, and phase shifted based changes in the waveguide modal refractive index induced by biasing of the MOS capacitor 124. A portion of the modulated and attenuated light can then tapped out of the optical waveguide 102 into bus waveguide 105 and output from optical modulator 100 for use downstream.

For example, FIG. 1B includes a DC power source 126. The DC power source 126 acts as a signal source and has a negative terminal connected to the cathode electrode 120 and a positive terminal connected the anode electrode 122. This results in a migration of negative charges from the cathode 104 toward a side of the optical waveguide 102 adjacent to the cathode 104, and migration of positive charges ("holes") from the anode 106 to an opposite side of the waveguide 102 (also referred to herein as accumulation mode). In other examples the polarity of the DC power source 126 may be reversed. Reversing the polarity of the DC power source 126 causes a migration of negative charges from the waveguide 102 toward cathode electrode 120, and migration of holes from the waveguide 102 toward anode electrode 122 (also referred to herein as depletion mode).

The MOS capacitor 124 forms at the boundary between the Group III-V material of the cathode 104 and the underlying capacitor portion of the intrinsic silicon or other Group IV material. A thin layer of silicon and Group III-V oxides (e.g., dielectric 118) forms naturally at this boundary and serves as a dielectric for the capacitor. In some examples, this thin layer has a thickness on a nanoscale, for example, a few nanometers thick. In some examples, steps need not be taken to encourage the formation of dielectric 118. In other examples, the formation of dielectric 118 may be stimulated, for example by elevating the temperature, exposing the materials to an oxygen-rich atmosphere, or other suitable technique.

In some examples, Group III-V material may comprise indium phosphide (InP). In other examples, Group III-V material may comprise gallium arsenide (GaAS) or other compounds of indium, gallium, phosphorus, and arsenic. More generally, the cathode and anode are formed of different materials which may comprise II-VI semiconductor compounds or other materials. Metals may be used.

As discussed previously, the MOS capacitor 124 is formed inside the optical waveguide 102 so that charge carriers that accumulate/deplete on either side of the capacitor dielectric have the effect of changing the index of refraction of the optical waveguide and waveguide loss (e.g., loss or attenuation of propagated signal power in the waveform).

The MOS capacitor 124 can operate in accumulation, depletion or inversion mode (e.g., accumulation of electrons at the dielectric layer in addition to presence of holes). As discussed above, a DC voltage can be applied between an anode and cathode, causing a thin charge layer to accumulate, deplete, or invert on both sides of the dielectric layer 118. The resulting change in free carrier density causes a change in refractive index n of the optical waveguide 102, which is manifested as a change in the effective refractive index of the optical mode ($\Delta n_{eff}$). The amount of change or modulation in the effective refractive index ($\Delta n_{eff}$) and associated change in optical losses ($\Delta\alpha$) can be described with as follows:

$$\Delta n_{eff} = \frac{-q^2 \lambda_0^2}{8\pi^2 c^2 n \varepsilon_0} \left( \frac{\Delta N_e}{m_{ce}^*} + \frac{\Delta N_h}{m_{ch}^*} \right) \quad \text{Eq. 1}$$

$$\Delta \alpha = \frac{-q^3 \lambda_0^2}{4\pi^2 c^3 n \varepsilon_0} \left( \frac{\Delta N_e}{m_{ce}^{*2} \mu_e} + \frac{\Delta N_h}{m_{ch}^{*2} \mu_h} \right) \quad \text{Eq. 2}$$

Where q is electrical charge applied to the cathode 104 and the anode 106, c is the speed of light in vacuum, $\varepsilon_0$ is the permittivity of free space, n is the material refractive index, $\Delta N$ represents a change in carrier density such that $\Delta N_e$ represents the change in carrier density in terms of electrons that $\Delta N_h$ represents the change in carrier density in terms of holes, m* represents the relative effective mass of electrons ($m^*_{ce}$) and holes ($m^*_{ch}$), $\mu_h$ represents the hole mobility, $\mu_e$ represents the electron mobility, and $\lambda_0$ is the free space wavelength.

An optical phase shift ($\Delta\varphi$) at the end of the capacitor depends on the magnitude of the voltage-induced $\Delta$neff, the device length L, and the optical wavelength $\lambda$. In this example, the optical phase shift can be calculated as $\Delta\varphi = 2\pi \Delta n_{eff} L \lambda$. Thus, the optical phase of the light within optical waveguide 102 may be shifted based on the voltage-induced $\Delta$neff. In various examples, the waveguide loss in silicon and Group III-V material may also change simultaneously as carrier density changes, and control of the change in the waveguide loss can be used as an optical attenuator. For example, changes in waveguide loss may be controlled based on the change in carrier density, which may impart attenuation of the waveguide losses. The attenuated waveguides losses can be used to modulate a signal.

As shown in FIG. 1A, the optical modular 100 may be a ring resonator optical modulator. In this case, trench 112, shown in FIG. 1B, is provided as an annular trench that divides the optical modulator into first and second portions 114 and 116, respectively. Similarly, the anode 106 is provided as an annular-shaped anode in the second portion and the cathode 104, dielectric 118, and the silicon layer 116 are cylindrical in shape in the first portion. The MOS capacitor 124 is defined across a boundary between the cathode and the anode.

Figure 1C:
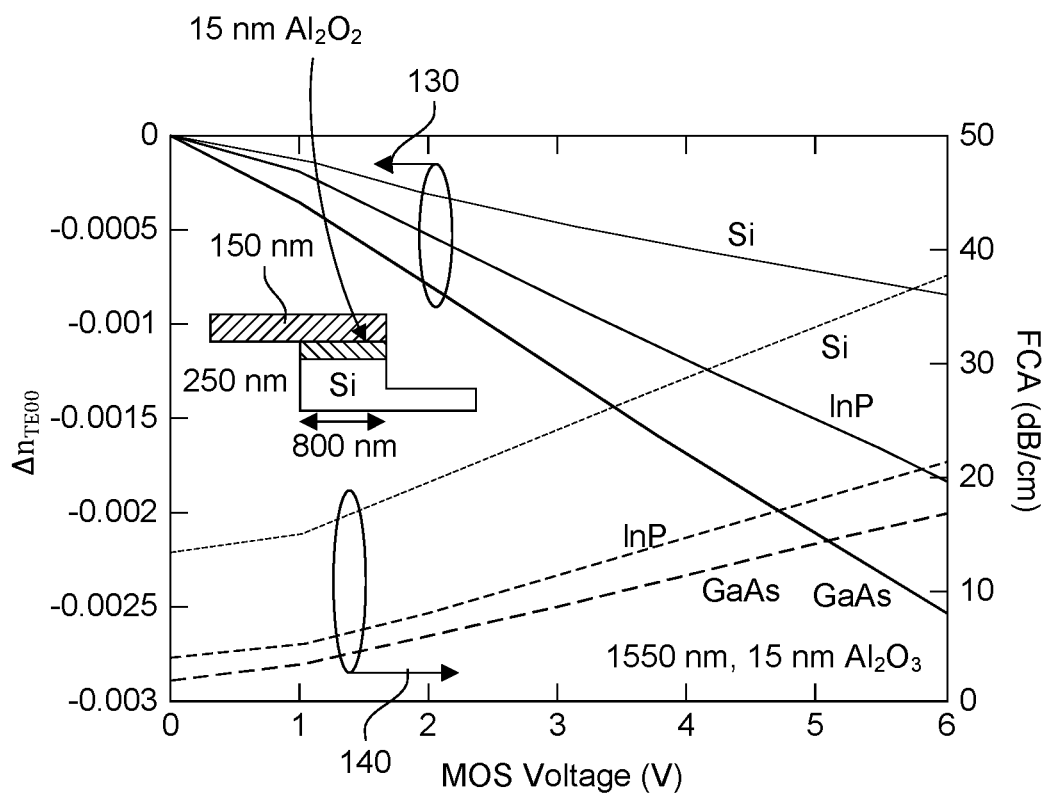
FIG. 1C shows simulated relationships between voltage applied to the optical modulator of FIGS. 1A and 1B for various cathode materials plotted against the change in modal refractive index and change in FCA.

FIG. 1C shows simulated relationships between voltage applied to the optical modulator 100 of FIGS. 1A and 1B for various cathode materials plotted against the change in refractive index ($\Delta$neff) of the optical mode of the waveguide (left axis) and change in free carrier absorption (FCA) (right axis). As indicated by pointer 130, solid lines show the change in refractive index ($\Delta$neff) for each material (e.g., Si, InP, and GaAs). Similarly, pointer 140 indicates that the dashed lines show the change in FCA for each material (e.g., Si, InP, and GaAs).

The example optical modulator used to generate FIG. 1C included cathode 106 having a thickness of 150 nm formed of one of Si, InP, or GaAS, as shown in FIG. 1C. The dielectric layer 118 had a thickness of 15 nm and was formed of dialuminum oxide ($Al_2O_3$). The anode 104 was formed of Si. The thickness of the portion the anode 104 in which the waveguide 102 is formed was 800 nm in width and 250 nm thick. This is an example configuration used to generate the simulated data displayed in FIG. 1C. Other configurations are contemplated.

As described above, the depletion or accumulation of charges at the interfacial layer results in a change of free carrier density that changes the local refractive index of the waveguide 102. However, in conventional systems, as shown in FIG. 1C, this effect is weak, slow and inefficient. For example, FIG. 1C shows a weak change in refractive index according to the left y-axis ($\Delta$neff). Implementations disclosed herein enhance the change in refractive index, for example, as described in connection with the FIGS. 4-6. Accordingly, examples disclosed herein enhance this effect, for example, by improving optical phase shift induced by the MOS capacitor by increasing the amount of change per applied voltage and/or decreasing an amount of time between applied voltage and induced change. Implementations disclosed herein combine a MOS capacitor modulator with a silicon device integrated into the optical waveguide that is configured to improve the efficiency of the optical phase shift by increasing changes in carrier concentration in the waveguide, for example, through integrating a resistor element, PIN junction diode, and/or a PN junction diode into the optical waveguide.

Figure 2:
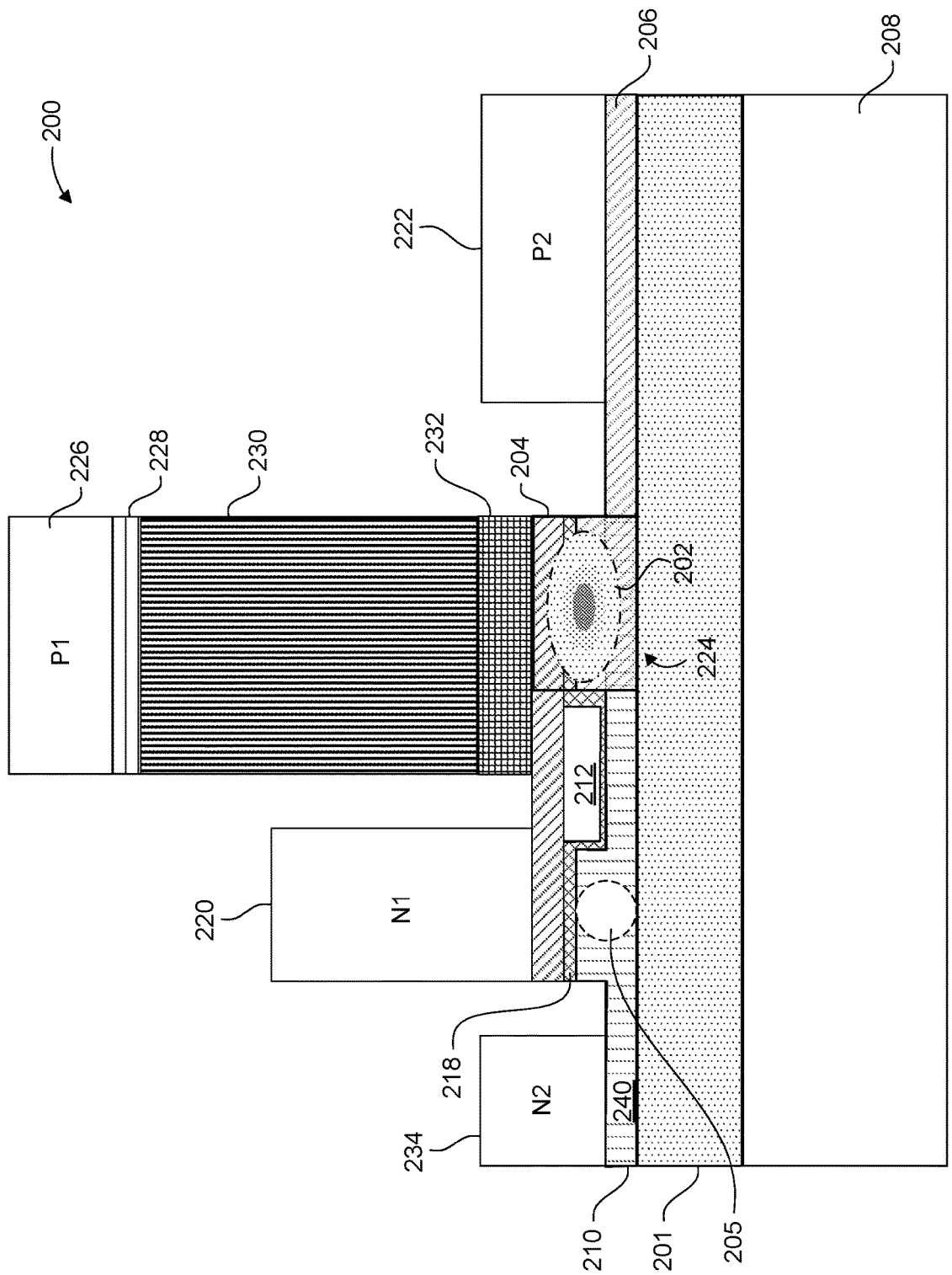
FIG. 2 illustrates an example optical device according to implementations disclosed herein.

FIG. 2 illustrates an example optical device according to implementations disclosed herein. Implementations herein are described as a MOS capacitor (MOSCAP) laser, and more particularly, as a micro laser including a hybrid MOS optical modulator. The optical device 200 may be a representation of a cross section of the optical device 300 of FIG. 3 taken along the line B-B'.

The optical device 200 includes an optical waveguide 202, a first cathode 204 comprising a first material and a portion of which is formed in the optical waveguide 202, and an anode 206 comprising a second material that is dissimilar from the first material and formed in the optical waveguide 202. The anode 206 adjoins the cathode 204 within the waveguide 202. A capacitor 224 is defined between the anode 206 and the cathode 204.

In various examples, a box layer 201 comprising oxide is grown on a substrate 208, for example, a varied oxide such as a silicon dioxide layer. Additionally, a silicon device layer 210 and the anode 206 are formed on the box layer 201. The cathode 204 is formed above the silicon device layer 210 opposite the box layer 201 and spans a trench 212 formed between the silicon device layer 240 and the capacitor 224. In various embodiments, the cathode 204 comprises a layer of Group III-V material as the first material, such as indium phosphide (InP), gallium arsenide (GaAS) or other compounds of indium, gallium, phosphorus, and arsenic. The cathode 204 may be formed by deposition, wafer bonding, monolithic growth, or other fabrication techniques. The anode 206 may comprise silicon or another Group IV material as the second material, for example, germanium, silicon carbide, silicon germanium, and so on. The capacitor 224 may be a MOSCAP defined between the cathode 204 and the anode 206.

A dielectric 218 (also referred to herein as an interfacial layer) is formed between the cathode 204 and the anode 202 and formed in the waveguide 202. The dielectric 218 can be native oxides of the cathode or the anode or both, or external dielectric materials such as high-k dielectrics or polymers which can be formed by deposition, oxidation, wafer bonding or other dielectric coating methods.

The MOSCAP 224 forms at the boundary between the first material of the cathode 204 and the underlying optical waveguide of semiconductor material (e.g., silicon or other Group IV material). A thin layer of silicon and III-V oxides (e.g., dielectric 218) forms at this boundary and serves as a dielectric for the capacitor. In some examples, the dielectric layer 218 may have a nanoscale thickness, for example, the dielectric layer 218 may be a few nanometers thick. In some examples, steps need not be taken to encourage the formation of dielectric 218. In other examples, the formation of dielectric 218 may be stimulated, for example by elevating the temperature, exposing the materials to an oxygen-rich atmosphere, or other suitable technique.

The cathode 204 may comprise negatively-doped silicon (e.g., a n-doped semiconductor layer) and the anode 206 may comprise positively-doped material (e.g., a p-doped semiconductor layer). In some implementations, the anode 206 comprises a heavy positively-doped material, for example, comprising carrier concentration (e.g., holes or electrons) that is larger than that of cathode 204. In an example, anode 206 may comprise a material doped to approximately 1e20 cm$^{-3}$. In some examples, the silicon device layer 210 may comprise a heavily doped material, for example, the silicon device layer 210 may comprise a material doped to approximately 1e20 cm$^{-3}$. A contact electrode 220 (also referred to as electrode 220) is disposed on the cathode 204 and a contact electrode 222 (also referred to as electrode 222) is disposed on the anode 206. When a voltage bias is applied to electrodes 220 and 222, carrier accumulation, depletion or inversion can occur around dielectric 220, as described in greater detail below. Due to the capacitor region overlapping with the optical waveguide, carrier concentration change may lead to changes in waveguide modal refractive index and propagation loss. By biasing the voltage applied between the electrodes 220 and 222, the refractive index may be modulated accordingly, thereby inducing optical intensity modulation, attenuation, and optical modal phase shift (e.g., shifting of wavelength carried by the waveguide 202).

Light propagated through optical waveguide 202 (e.g., orthogonal to the FIG. 2) is modulated, attenuated, and phase shifted based on changes in waveguide modal refractive index induced by biasing of the MOSCAP 224. A portion of the modulated and attenuated light can then tapped out of the optical waveguide 202 into bus waveguide 205 via a channel between the trench 212 and box layer 201 and output from optical device 200 for use downstream. The box layer 201 may be provided to confine the optical mode in a vertical direction (e.g., into the layers provided on the box layer 201).

As discussed above, the MOS capacitor is formed inside the optical waveguide 202 so that charge carriers that accumulate/deplete on either side of the capacitor dielectric have the effect of changing the index of refraction of the waveguide and changing propagation loss.

The MOS capacitor can operate in accumulation, depletion, or inversion mode. As discussed above, a DC voltage can be applied between anode 206 and cathode 204, causing a thin charge layer to accumulate, deplete, or invert on both sides of the dielectric layer 218. The resulting change in free carrier density causes a change in refractive index n of the waveguide 202, which is manifested as a change in the effective refractive index of the optical mode ($\Delta n_{eff}$). The amount of change or modulation in the effective refractive index ($\Delta n_{eff}$) and associated change in optical losses (La) can be described with as set forth above in Eqs. 1 and 2. The voltage-induced Δneff also causes an optical phase shift of light propagating in the optical waveguide 202, as discussed above, To enhance the change in effective refractive index and optical phase shift induced in the optical waveguide 202, the silicon device layer 210 is formed on the box layer 201 and in the waveguide 202. The silicon device layer 210 includes the anode 206 and a second cathode 240 comprising a third material formed in the bus waveguide 205. The third material may be a silicon or another Group IV material, which may be the same or different from that of the cathode 204. The second cathode 240 is also formed in the optical waveguide 202, thereby providing the channel through which a portion of light traversing the waveguide 202 can be tapped into the bus waveguide 205. The second cathode 240 is formed in the silicon device layer 210 and is overlapped with the trench 212.

As noted above, the change in modal effective refractive index and phase shift induced by voltage bias applied to the MOS capacitor is small, and is enhanced by the implementations disclosed herein through the use of silicon device layer 210. For example, as described above, implementations disclosed herein provide for improving phase tuning efficiency, which translates to wider wavelength shifts which may be used for direct high speed modulation and/or alignment to resonator based modulators. For example, the second cathode 240 may comprise a doped material, which may be positively- or negatively-doped material (e.g., a n-doped semiconductor layer or a p-doped semiconductor layer) and the optical waveguide 202 may comprise intrinsically doped material or positively- and/or negatively-doped material (e.g., a n-doped semiconductor layer or a p-doped semiconductor layer). The second cathode 240 may be heavy doped material of either polarity (e.g., 210 may comprise a material doped to approximately 1e20 cm$^{-3}$). A contact electrode 234 is disposed on the cathode 240. When a voltage bias is applied between the electrodes 234 and 222, enhancement of the carrier accumulation, depletion or inversion can occur within the optical waveguide 202 based on the doped materials of the silicon device layer 210, as described in greater detail below. Due to the silicon device layer 210 formed in the optical waveguide 202, carrier concentration change may enhance changes in waveguide modal refractive index and propagation loss induced by biasing the MOSCAP 224.

In various examples, the dielectric 218 is formed between the cathode 240 and the cathode 204. In the example shown in FIG. 2, the dielectric 218 is formed continuously from the cathode 204 to the optical waveguide 202 so as to overlap with the trench 212. In another example, the dielectric 218 may not be present within trench 212. In this case, two dielectrics 218 may be formed, a first dielectric between optical waveguide 202 and cathode 204 and a second between cathode 240 and the cathode 204.

Additionally, in various examples, the optical device 200 includes an optional light-emitting portion configured to generate light that is injected into the optical waveguide 202. The light generated by the light-emitting portion may be modulated based on biasing the MOSCAP 224 and the second cathode 240, and a portion of the modulated light may be tapped off into the bus waveguide 205. In a case that the light-emitting portion is not included in the optical device 200, light may be received from the bus waveguide 205 and tapped off into the optical waveguide 202, as described above. The tapped off light may then be modulated based on biasing the MOSCAP 224 and the second cathode 240 and then output into the bus waveguide 205.

The light-emitting portion may be a light-emitting diode, laser diode, and the like. In the illustrative example shown in FIG. 2, the optical device 200 includes an optical gain material 232 (or laser gain material in the case of a laser diode) formed on the cathode 204. The optical gain material 232 may comprise, for example, quantum dot (QD) or quantum wells (QW). A doped semiconductor layer 230 is formed between the optical gain material 232 and a highly doped semiconductor layer 228. The semiconductor layers 230 and 228 may comprise silicon or another Group IV material. In various examples disclosed herein, in the case of dopants added on the order of one dopant atom is added per 100 million atoms the material may be referred to as low or lightly doped. Whereas, in the case of many more dopant atoms are added, such as on the order of one per ten thousand atoms the material may be referred to as highly doped. In one illustrative example, semiconductor layer 230 may be doped between 5e17 and 5e18 $cm^{-3}$, semiconductor layer 230 may be doped between 5e17 and 5e18 $cm^{-3}$; silicon device layer 210 and anode 206 may be doped to approximately 1e20 $cm^{-3}$, and highly doped semiconductor layer 228 may be doped between 5e18 and 5e19 $cm^{-3}$.

The doped semiconductor layer 230 may comprise positively-doped silicon (e.g., a p-doped semiconductor layer) and the highly doped semiconductor layer 228 may comprise positively-doped silicon (e.g., a highly p-doped semiconductor layer). An electrode 226 may be formed on the highly doped semiconductor layer 228 opposite the doped semiconductor layer 230. When a voltage bias is applied between the electrodes 226 and 220, carrier concentration change leads to stimulated emission in the optical gain material 230, thereby generating light. Generated light traverses the layers and is received at the waveguide 202, which is then modulated according to biasing of the MOSCAP and silicon device layer 210. A portion of the modulated light is tapped into the waveguide 205 for use downstream. Control of the width of the trench 212 alters an amount of light from the optical waveguide 202 that is injected into the waveguide 205 (e.g., a larger width results in a smaller percentage of light injected into the waveguide).

Accordingly, by biasing the voltage applied between the electrodes 226 and 220, light emission is generated by the optical device 200 and injected into the optical waveguide 202. The light may then be modulated and attenuated by changing the refractive index of the optical waveguide 202 by biasing a voltage applied to the capacitor region, which may be enhanced by biasing the silicon device layer region. For example, employing phase shift and modulation though separate electrical contacts (e.g., applying voltage bias between electrode 220 and electrode 222, while simultaneously applying a bias between electrode 234 and electrode 222), implementations herein can obtain not only a non-return-to-zero (NRZ) modulation with larger optical modulation amplitude (OMA) with two synchronous NRZ electrical signals, but also a pulse amplitude modulation (e.g., PAM4) with two separate NRZ electrical signals. For example, independently biasing voltages applied to each pair of electrode contacts allows for separate modulation. As an illustrative example, the MOSCAP 224 and second cathode 240 may be independently biased so to induce varying modulations of phase shifting properties. Furthermore, biasing of the light-emitting portion may permit modulation of the amplitude of the output light along with the modulation of the phase shift. As an illustrative example, by biasing the voltage across electrodes 226 and 220 of the light-emitting portion to induce an amplitude modulation of the light (e.g., varying light intensity), while also biasing the MOSCAP 224 and second cathode 240 to induce a phase shift modulation.

While FIG. 2 illustrates the optical device 200 including the light-emitting portion, the present disclosure is not so limited. For example, the optical device 200 need not include the light-emitting portion and may receive light from an external source, for example, similar to the optical modulator 100 described above. Additionally, while certain materials are described as negatively- or positively-doped, implementations are not limited thereto, and the polarity doping may switched. For example, while the above example described the cathode 204 as negatively-doped the anode 206, layer 230, and layer 228 as positively-doped, the polarity of each layer may be switched such that the cathode 204 is positively-doped and the anode 206, layer 230, and layer 228 may be negatively-doped.

Figure 3:
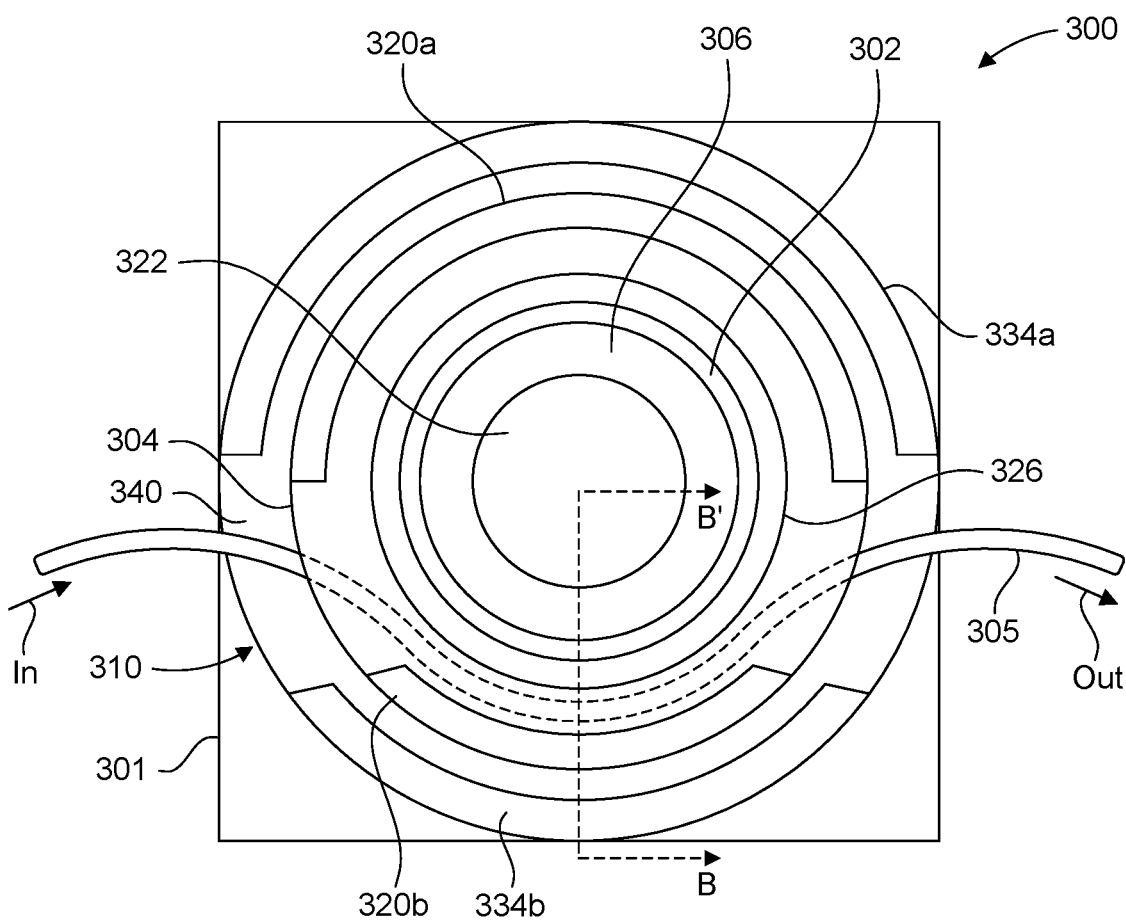
FIG. 3 illustrates a top-down view of an example optical device according to implementations disclosed herein.

FIG. 3 illustrates a top-down view of an example optical device according to implementations disclosed herein. The optical device 300 of FIG. 3 illustrates a micro laser including a hybrid MOS optical modulator having a ring-shaped structure, for example, a micro-ring laser including a hybrid MOS optical modulator (generally referred to here as a MOSCAP micro-ring laser or simply a MOSCAP laser). In an illustrative example, optical device 300 is an example of optical device 200 comprising a ring or annular shaped structure when viewed from above. For example, optical device 200 of FIG. 2 may be a representation of a cross section of optical device 300 taken along the line B-B'. Accordingly, reference numbers in FIG. 3 may correspond to similar reference numbers in FIG. 2. For example, reference number 302 in FIG. 3 may correspond to optical waveguide 202 of FIG. 2, reference number 305 may correspond to bus waveguide 205, etc. As such, the elements and structures of FIG. 3 include properties and characteristics as described above in connection with FIG. 2, except as set forth herein with reference to FIG. 3.

Optical device 300 is formed on a box layer 301 and a silicon device layer 310 is formed thereon. An annular-shaped cathode 304 is formed on top of the silicon device layer 310 having a thin dielectric (e.g., similar to dielectric 218) therebetween (not shown) and spans a trench (not shown). The silicon device layer 310 is formed in bus waveguide 305 and optical waveguide 302. The silicon device layer 310 includes a cylindrical-shaped anode 306, an annular-shaped optical waveguide 302, and an annular-shaped cathode 340. The cylindrical-shaped anode 306, having an electrode 322 formed thereon, is encircled by the annular-shaped optical waveguide 302 and annular-shaped cathode 340. The waveguide 305 is formed in the cathode 340. An MOS capacitor is defined between the cathode 304 and the anode 306 using the dielectric formed between the cathode 304 and anode 306.

In the illustrative example of FIG. 3, a cylindrically-shaped electrode 322 is formed on the anode 306; electrodes 320a and 320b (collectively electrodes 320) are formed on the cathode 304; and electrodes 334a and 334b (collectively electrodes 334) are formed on the cathode 340. The cathode 304 may have electrode 320a, electrode 320b, or both as desired. Each electrode 320 may be partially annular-shaped and may partially encircle the anode 306. In another example, the electrodes 320 may be integrated as a single electrode 320 having an annular-shape that encircles the anode 306. Similarly, the cathode 340 may have electrode 334*a*, electrode 334*b*, or both as desired. Each electrode 334 may be partially annular-shaped and may partially encircle the anode 306. In another example, the electrodes 334 may be integrated as a single electrode 334 having an annular-shape that encircles the anode 306.

Additionally, similar to optical device 200, optical device 300 includes a light emitting portion formed of an annular-shaped optical gain material underlying electrode 326 that encircles the anode 306. A doped semiconductor layer is formed between the optical gain material and a highly doped semiconductor layer, which underlies the electrode 326 as described in connection with FIG. 2.

In operation, light propagates in the optical waveguide 302 in a circular direction around the ring-shaped resonator. A portion of the light is then tapped out of the optical waveguide 302 into the bus waveguide 305, which is then output to downstream devices.

As alluded to above, the modulation and attenuation due to biasing the voltage applied to the capacitor region may be enhanced by the inclusion of the silicon device layer as set forth herein (e.g., silicon device layer 210 and/or 310) formed in an optical waveguide (e.g., waveguide 202 and/or 302). More particularly, a silicon device layer according to implementations herein may be doped so as to induce change in carrier concentration in the waveguide in response to voltages applied. For example, with reference to FIG. 2, the silicon device layer 210 may comprise a heavy positively-doped material (e.g., silicon or the like) integrating a resistor element into the optical waveguide 202 (or 302). As another example, the silicon device layer 210 may comprise heavy negatively-doped material (e.g., silicon or the like) integrating a positive-intrinsic-negative (PIN) junction diode element into the optical waveguide 202 (or 302), where the optical waveguide is an intrinsically doped region. In yet another example, the silicon device layer 210 may comprise a first region of a heavy negatively-doped material (e.g., silicon or the like) and a second region of a negatively-doped material (e.g., silicon or the like) integrating a positive-negative (PN) junction diode element into the optical waveguide 202 (or 302). Further details regarding each implementation are provided below with reference to FIGS. 4-6.

Figure 4:
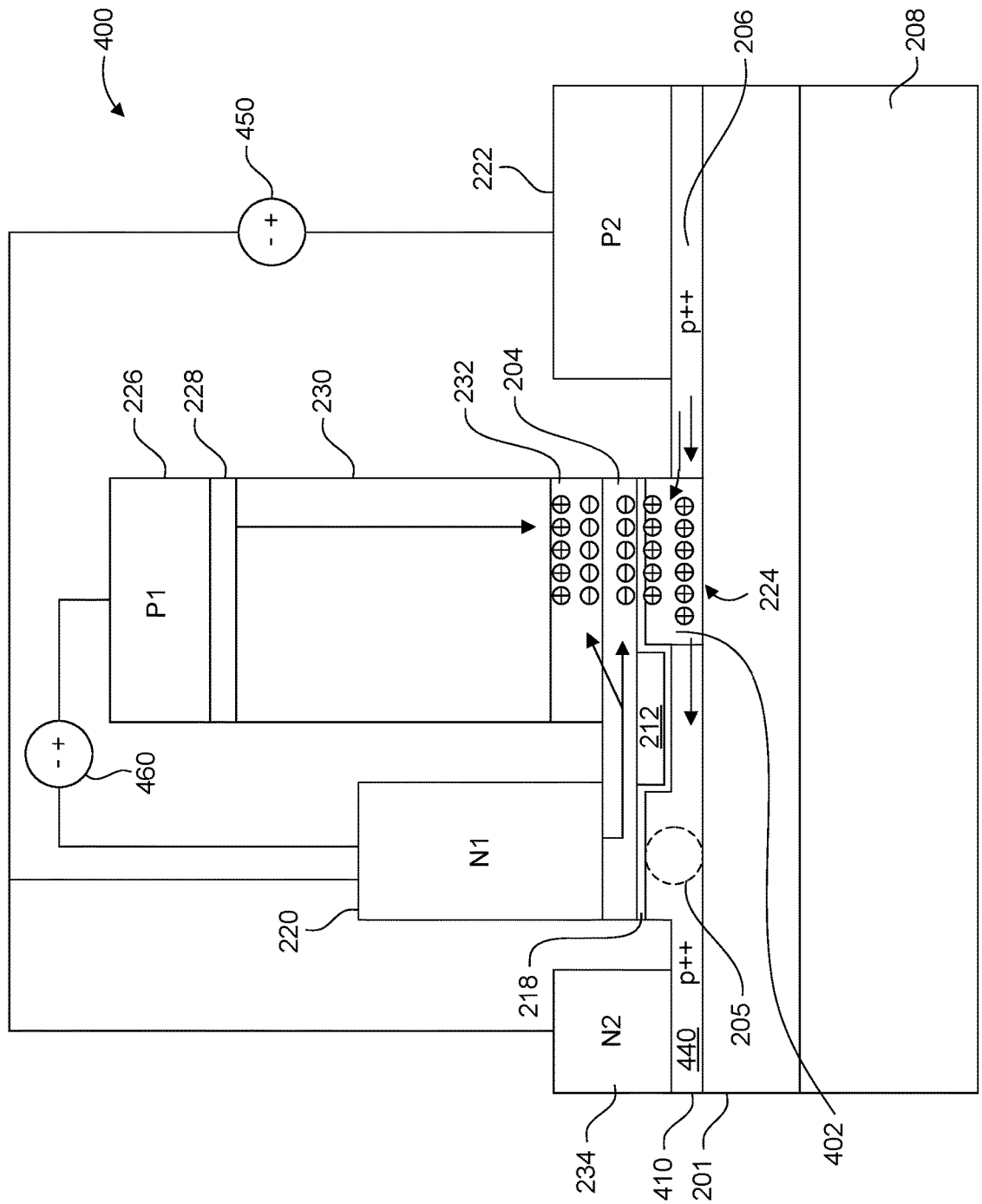
FIG. 4 illustrates an example optical device integrated with a resistor element according to an implementation disclosed herein.

FIG. 4 illustrates an example optical device 400 according to an implementation disclosed herein. FIG. 4 shows an optical device 400 that is similar to, or the same as, the optical device 200 of FIG. 2 and/or optical device 300 of FIG. 3, such that like reference numbers in FIG. 4 represent the same elements from FIG. 2. Thus, as with optical devices 200 and 300, optical device 400 includes a capacitor region and an optical light-emitting portion as set forth above in connection with FIGS. 2 and 3.

Additionally, optical device 400 includes a silicon device layer 410 that is similar to the silicon device layer 210 of optical device 200, except that the optical waveguide 402 is integrated with a resistor element. For example, the silicon device layer 410 may be substantially similar to the silicon device layer 210 of FIG. 2, except that the cathode 440 comprises a heavy positively-doped material, such as silicon or other Group IV material. Additionally, the waveguide 402 includes an intrinsically doped material (e.g., silicon or other Group IV) between and in contact with the cathode 440 and the anode 206. In this implementation, as noted above, the anode 206 comprises a heavy positively-doped material. Accordingly, changes in carrier concentration in the waveguide 402 results in a highly resistive region that generates heat based on a flow of charges passing between the highly doped contacts to the waveguide 402. Thus, a resistor element is integrated into the waveguide 402.

In the illustrative example shown in FIG. 4, a power source 450 is electrically coupled between electrodes 222 and 220 and between electrodes 222 and 234. The power source 450 may be a DC power source having a negative terminal connected to the electrodes 220 and 234 and a positive terminal connected the electrode 222. The power source 450 may be controlled, for example, by a controller (e.g., implemented as a computer system described in FIG. 8) to apply voltage bias between the respective electrodes. That is, a bias may be applied between electrode 222 and 234 simultaneously with a bias applied between electrodes 222 and 220. While the example shown in FIG. 4 provides a single power source 450, a plurality of power sources may be used in place of power source 450. For example, a first power source may be used to apply a first voltage bias across electrodes 222 and 220 and a second power source may be used to apply a second voltage bias across electrodes 222 and 234. As such, voltage bias may be independently controlled across respective electrodes simultaneously.

When a voltage is applied between the electrodes 222 and 220 according to the example shown in FIG. 4 (e.g., power source 450), negative charge and holes accumulate around the interfacial layer 218. For example, as shown in FIG. 4, negative charges from the cathode 204 migrate to toward the waveguide 402, and holes (positive charges) migrate from the anode 206 to the waveguide 402. The accumulation of charge and change in carrier concentration cause changes in the waveguide refractive index and propagation loss, as described above.

When a voltage is applied between the electrodes 234 and 222 according to the example shown in FIG. 4, positive charge passes through the optical device thereby generating heat in the waveguide 402. For example, as shown in FIG. 4, holes (e.g., positive charges) migrate from the highly positively-doped anode 206 to the intrinsically doped waveguide 402. The flow of charge in the waveguide 402 leads to a resistive region that generates heat. The generation of heat increases the waveguide effective refractive index of the mode as follows:

$$-\nabla \cdot (k \nabla T) = Q \qquad \text{Eq. 3}$$

Where the thermal effect is modeled by the steady-state heat equation (Poisson's equation) shown as Eq. 3. K is the coefficient of heat conduction, Q is the total charge (e.g., carrier concentration) of the heat source, and T is the temperature. The thermal effect may be numerically simulated for a certain structure. Once the gradient of T is obtained, a material's thermo-optic coefficient (dn/dT) may be used to calculate the change in refractive index which is defined by dn.

Accordingly, the change in the effective refractive index may be enhanced through generation of heat in the waveguide 402 from the integrated resistor element. For example, increased temperature can induce additional and quicker change in the effective refractive index in concert with along with the change in refractive index induced by biasing the voltage applied to the capacitor region.

In another example the polarity of the power source 450 may be reversed. Reversing the polarity of the power source causes a migration of negative charges from the waveguide 402 toward electrode 220, and migration of holes from the waveguide 402 toward electrode 222. Similarly, reversing the polarity of the power source causes a migration of holes charges from the waveguide 402 toward electrode 222, thereby reducing the resistive characteristics and decreasing temperature.

Furthermore, the optical phase ($\Delta\varphi$) is also changed based on the change in temperature as follows:

$$\Delta\varphi = \frac{2\pi L_H}{\lambda_0} \frac{dn}{dT} \Delta T \qquad \text{Eq. 4}$$

where $L_H$ a thermal length of the waveguide 402, dn/dT is a thermos-optic coefficient dependent on the material from which the waveguide 402 is formed (e.g., indicative of a change in refractive index with the response to temperature), $\Delta T$ is the change in temperature of the waveguide 402, and $\lambda_0$ is the free space wavelength. Thus, biasing the electrodes 234 and 222 improves the phase shift of the optical mode in the waveguide 202 by enhancing the changes induced by the MOSCAP 224.

Furthermore, with respect to the optional light-emitting portion, when a voltage is applied between the electrodes 226 and 220 according to the example shown in FIG. 4 (e.g., via power source 460), negative charge and holes accumulate in the optical gain material 232, thereby function as a pumping source. For example, as shown in FIG. 4, a negative terminal of power source 460 (which may be a DC power source) may be connected to the electrode 220 and a positive terminal connected the electrode 226. Accordingly, negative charges from the cathode 204 migrate to the optical gain material 232, and holes (positive charges) migrate from the highly doped semiconductor layer 228 through the doped semiconductor layer 230 to the optical gain material 232. The accumulation of charge and holes provides energy transition states to generate stimulated emissions resulting in optical gain, from which light may be emitted. Emitted light propagates through the cathode 204 into the waveguide 402. A portion of the light in the waveguide 402 can then be tapped out of the waveguide 402 into the bus waveguide 205 via a channel between the trench 212 and box layer 201. The light may be modulated according to voltage bias applied to the electrodes as set forth above.

One non-limiting advantage provided by the optical device 400 is that, since the waveguide 402 is intrinsically doped, the optical loss is kept low, albeit with increase heating underneath the laser structure which can possibly reduce overall-wall-plug efficiency.

Figure 5:
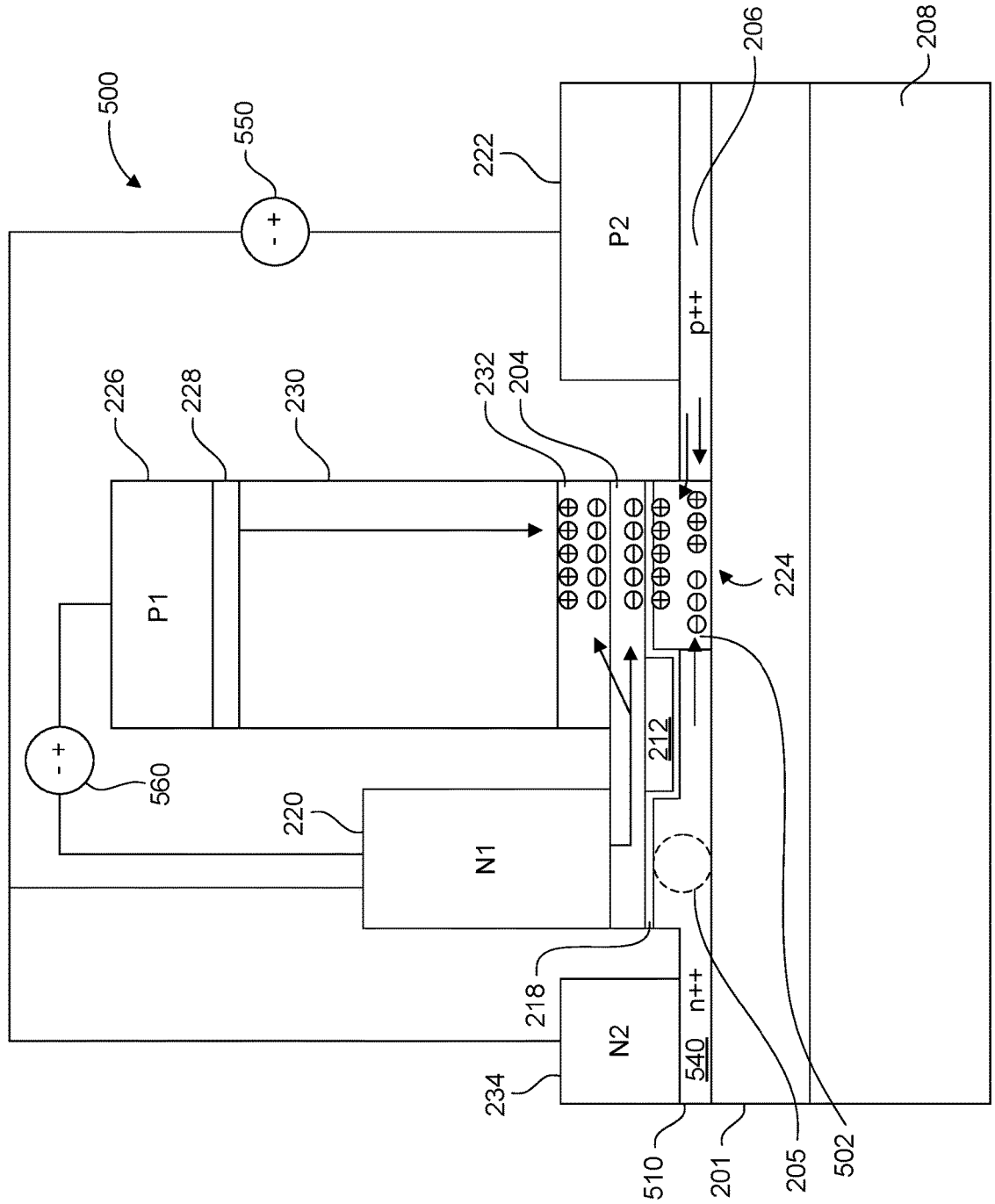
FIG. 5 illustrates an example optical device integrated with a positive-intrinsic-negative (PIN) junction diode element according to an implementation disclosed herein.

FIG. 5 illustrates an example optical device 500 according to an implementation disclosed herein. FIG. 5 shows an optical device 500 that is similar to the optical device 200 of FIG. 2 and/or optical device 300 of FIG. 3, such that like reference numbers in FIG. 5 represent the same elements from FIG. 2. Thus, as with optical devices 200 and 300, optical device 500 includes a capacitor region and an optical light-emitting portion as set forth above in connection with FIGS. 2 and 3.

Additionally, optical device 500 includes a silicon device layer 510 that is similar to the silicon device layer 210 of optical device 200, except that the optical waveguide 502, which is similar to waveguide 202, is integrated with a PIN junction diode element. For example, the silicon device layer 510 may be substantially similar to the silicon device layer 210 of FIG. 2, except that cathode 540 comprises a heavy negatively-doped material, such as silicon or other Group IV material. Additionally, the optical waveguide 502 is an intrinsically doped semiconductor material (e.g., silicon or other Group IV material) between and in contact with the cathode 540 and the anode 206. In this implementation, as noted above, the anode 206 comprises a heavy positively-doped material. Accordingly, the combination of the cathode 540, intrinsically doped waveguide 502, and anode 206 function as a PIN junction diode and may inject carriers and holes into the waveguide 502. The injection of carriers and holes may also induce a change in temperature (e.g., increased heat).

As with FIG. 4 above, a power source 550 is electrically coupled between electrodes 222 and 220 and between electrodes 222 and 234. The power source 550 may be a DC power source having a negative terminal connected to the electrodes 220 and 234 and a positive terminal connected the electrode 222. The power source 550 may be controlled, for example, by a controller (e.g., implemented as a computer system described in FIG. 8) to apply voltage bias between the respective electrodes. That is, a bias may be applied between electrode 222 and 234 simultaneously with a bias applied between electrodes 222 and 220. While the example shown in FIG. 5 provides a single power source 550, a plurality of power sources may be used in place of power source 550. For example, a first power source may be used to apply a first voltage bias across electrodes 222 and 220 and a second power source may be used to apply a second voltage bias across electrodes 222 and 234. As such, voltage bias may be independently controlled across respective electrodes simultaneously.

Similar to optical device 400 of FIG. 4 above, when a voltage is applied between the electrodes 222 and 220 according to the example shown in FIG. 5, negative charge and holes accumulate around the interfacial layer 218. The accumulation of charge and change in carrier concentration lead to changes in the waveguide refractive index and propagation loss, as described above.

When a voltage is applied between the electrodes 234 and 222 according to the example shown in FIG. 5, positive charges and negative charges accumulate in the optical waveguide 502. For example, as shown in FIG. 5, negative charges from the cathode 540 migrate to the optical waveguide 502, and holes (positive charges) migrate from the anode 206 to the optical waveguide 502. The change of carrier concertation and distribution in the silicon device layer 510 leads to additional changes in waveguide modal refractive index and propagation loss. For example, the refractive index change is a result of a plasma dispersion effect in the waveguide 502. The amount of change can be determined by experimental results, as shown below for a waveguide formed of silicon:

$$\Delta n(@\ \lambda_0 = 1310\ \text{nm}) = -2.98 \times 10^{-22} \times \Delta N^{1.016} - 1.25 \times 10^{-18} \times \Delta P^{0.835} \qquad \text{Eq. 5}$$

$$\Delta n(@\ \lambda_0 = 1550\ \text{nm}) = -5.4 \times 10^{-22} \times \Delta N^{1.011} - 1.53 \times 10^{-18} \times \Delta p^{0.838} \qquad \text{Eq. 6}$$

where $\Delta n$ is the change of refractive index, $\Delta N$ and $\Delta P$ are change of free electron (e.g., negative charge) and hole (e.g., positive charge) densities, respectively. Eq. 5 and Eq. 6 illustrate that hole accumulation enable a larger refractive shift than electron accumulation. Accordingly, one approach to improve the phase shift efficiency is through increased accumulation of holes inside the waveguide 502 by using example of FIG. 5. Another approach to improve phase shift efficient is by increasing total free carrier densities inside the waveguide 502; however, this could lead to increased optical loss due to free carrier absorption.

Furthermore, the accumulation of carriers and holes in the waveguide 502 may induce an increase in temperature (e.g., generating heat). As described above in connection with FIG. 4, heat generation may enhance the refractive index change and phase shift efficiency.

In another example the polarity of the power source 550 may be reversed. Reversing the polarity of the power source causes a migration of negative charges from the waveguide 502 toward electrode 220, and migration of holes from the waveguide 502 toward electrode 222. Similarly, reversing the polarity of the power source causes a migration of holes from the waveguide 502 toward electrode 222 and migration of electrons from the waveguide 502 toward electrode 234.

Additionally, the optional light-emitting portion of FIG. 5 functions as described above in connection with FIG. 3. For example, when a voltage (e.g., via power source 560) is applied between the electrodes 226 and 220 according to the example shown in FIG. 5, negative charge and holes accumulate in the optical gain material 232, thereby function as a pumping source from which light may be emitted and propagate into the waveguide 502.

Figure 6:
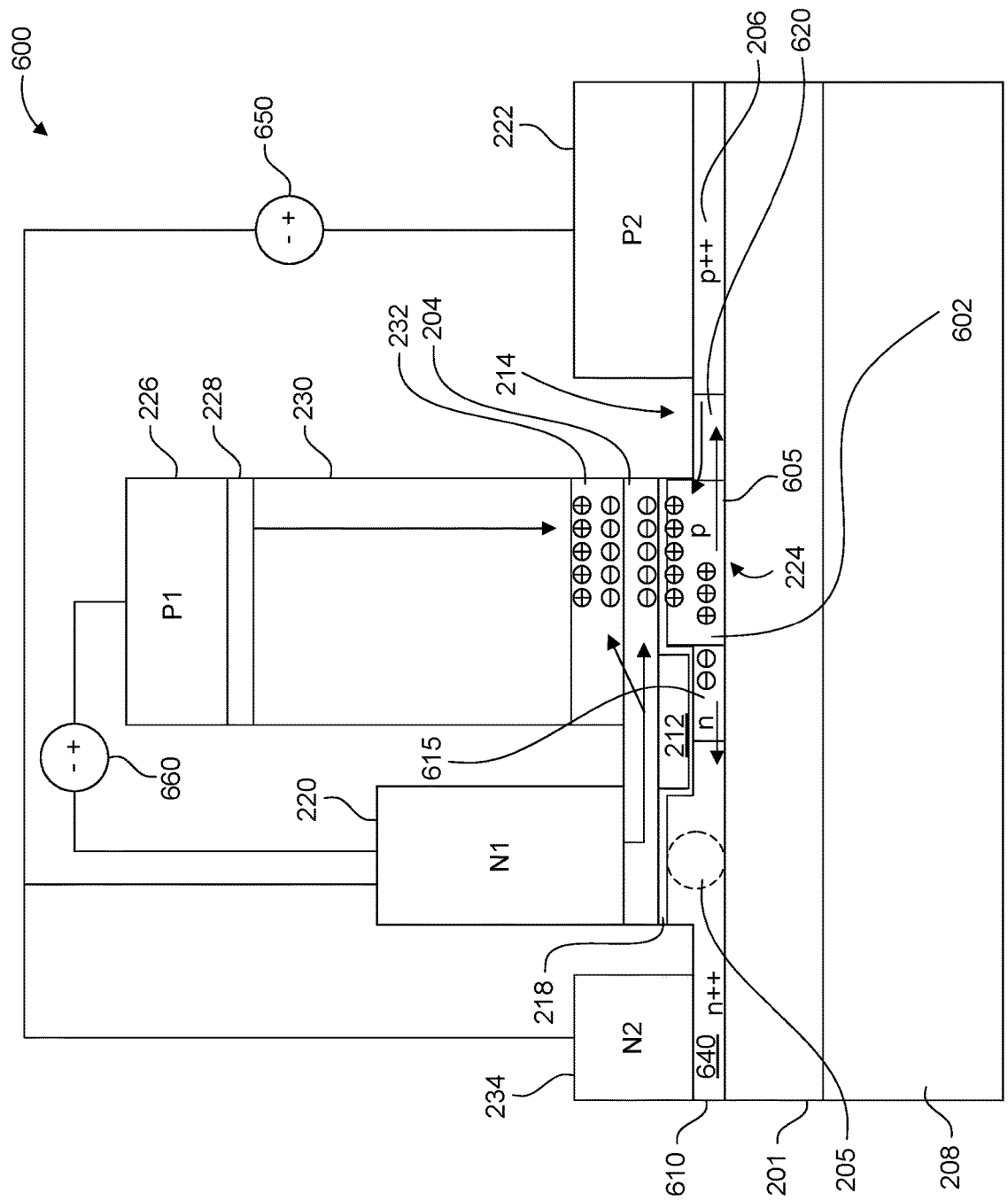
FIG. 6 illustrates an example optical device integrated with a positive-negative (PN) junction diode element according to an implementation disclosed herein.

FIG. 6 illustrates an example optical device 600 according to an implementation disclosed herein. FIG. 6 shows an optical device 600 that is similar to the optical device 200 of FIG. 2 and/or optical device 300 of FIG. 3, such that reference numbers in FIG. 6 represent the same elements from FIG. 2. Thus, as with optical devices 200 and 300, optical device 600 includes a capacitor region and an optical light-emitting portion as set forth above in connection with FIGS. 2 and 3.

Additionally, optical device 600 includes a silicon device layer 610 that is similar to the silicon device layer 210 of optical device 200, except that the optical waveguide 602, which is similar to waveguide 202, is integrated with a PN junction diode element. For example, the silicon device layer 610 may be similar to the silicon device layer 510 of FIG. 5, for example, the cathode 640 is a heavy negatively-doped material and the anode 206 is a heavy positively-doped material. However, in the example of FIG. 6, the waveguide 602 comprises a first region 605 comprising a positively-doped material (e.g., such as silicon or other Group IV material) and a second region 615 comprising a negatively-doped material (e.g., such as silicon or other Group IV material). Further still, a third region 620 is disposed between the anode 206 and the waveguide 602 that comprises a lightly-doped material. Accordingly, the waveguide 602 is similar to waveguide 202 integrated with a PN junction diode that may change the carrier concentration in the waveguide 602. The change the carrier concentration may also induce a change in temperature (e.g., increased heat).

Similar to the preceding examples, a power source 650 is electrically coupled between electrodes 222 and 220 and between electrodes 222 and 234. The power source 650 may be a DC power source having a negative terminal connected to the electrodes 220 and 234 and a positive terminal connected the electrode 222. The power source 650 may be controlled, for example, by a controller (e.g., implemented as a computer system described in FIG. 8) to apply voltage bias between the respective electrodes. That is, a bias may be applied between electrode 222 and 234 simultaneously with a bias applied between electrodes 222 and 220. While the example shown in FIG. 6 provides a single power source 650, a plurality of power sources may be used in place of power source 650. For example, a first power source may be used to apply a first voltage bias across electrodes 222 and 220 and a second power source may be used to apply a second voltage bias across electrodes 222 and 234. As such, voltage bias may be independently controlled across respective electrodes simultaneously.

Similar to the preceding examples, when a voltage is applied between the electrodes 222 and 220 according to the example shown in FIG. 6, negative charge and holes accumulate around the interfacial layer 218. The accumulation of charge and change in carrier concentration leads to changes in the waveguide refractive index and propagation loss, as described above.

When a voltage is applied between the electrodes 234 and 222 according to the example shown in FIG. 6, positive charge and negative charge distribution changes in the optical waveguide 602. For example, as shown in FIG. 6, negative charges from the second region 615 migrate out to the cathode 340, and holes (positive charges) migrate from the first region 605 to the anode 206. The change of carrier concertation and distribution in the waveguide 602 leads to additional changes in waveguide modal refractive index and propagation loss. For example, the refractive index change is a result of a plasma dispersion effect in the waveguide 602. The amount of change can be determined by the experimental results of Eqs. 5 and 6, as shown above.

As shown in Eqs. 5 and 6, holes provide for a larger refractive shift than electrons. Therefore, one way to improve the phase shift efficiency is by including more holes inside the waveguide 602 by using the offset the PN junction design of FIG. 6. A second way is by increasing total free carrier densities inside the optical waveguide 602, with a tradeoff in optical loss due to free carrier absorption. One method of addressing the optical loss is by utilizing different junction shapes. For example, L-shape and U-shape PN junctions may improve the overlap between carrier change area and optical mode so to improve phase shift efficiency.

In another example the polarity of the power source 650 may be reversed. Reversing the polarity of the power source causes a migration of negative charges from the waveguide 602 toward electrode 220, and migration of holes from the waveguide 602 toward electrode 222. Similarly, reversing the polarity of the power source causes a migration of holes from the electrode 222 toward the first region 605 and migration of electrons from electrode 234 toward the second region 615.

Additionally, the optional light-emitting region of FIG. 6 functions as described above in connection with FIG. 3. For example, when a voltage (e.g., via power source 660) is applied between the electrodes 226 and 220 according to the example shown in FIG. 6, negative charge and holes accumulate in the optical gain material 232, thereby function as a pumping source from which light may be emitted and propagate into the waveguide 502.

While FIGS. 4-6 illustrate optical devices including a light-emitting portion, the present disclosure is not so limited. For example, the optical devices described above need not include the light-emitting portion and may receive light from an external source, for example, similar to the optical modulator 100 described above. Additionally, while the various materials are described as negatively- or positively-doped, implementations herein are not limited thereto, and the polarity doping may switched. For example, while the above example described the cathode 204 as negatively-doped the anode 206, layer 230, and layer 228 as positively-doped, the polarity of each layer may be switched such that the cathode 204 is positively-doped and the anode 206, layer 230, and layer 228 may be negatively-doped. Similarly, in the case that the doping polarity is switched, the polarity of the doping of the second cathode (e.g., cathodes 440, 540, and 640) and the optical waveguide (e.g., optical waveguides 402, 502, and 602) are also switched.

Figure 7:
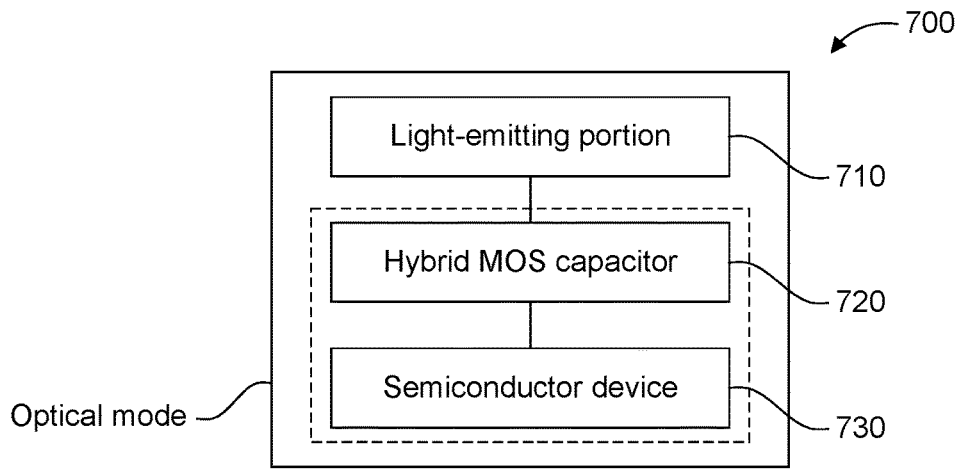
FIG. 7 is a schematic diagram of an example optical device according to implementations disclosed herein.

FIG. 7 is a schematic diagram of an example optical device according to implementations disclosed herein. FIG. 7 illustrates an optical device 700 comprising a hybrid MOS capacitor 720, a semiconductor device 730, and an optional light-emitting portion 710.

The hybrid MOS capacitor 720 may be configured to induce optical intensity modulation and attenuation, for example, based on biasing a voltage applied to the hybrid MOS capacitor 720 to induce a change in effective refractive index and a change in optical phase, respectively. The hybrid MOS capacitor 720 may be implemented, for example, as the anode 206, cathode 204, and interfacial layer 218 in contact with waveguide 202, as described above in connection with FIGS. 2-6.

The semiconductor device 730 may be configured to enhance the modulation and attenuation induced by the capacitor 720, for example, based on biasing a voltage applied to the semiconductor device 730 that induces additional changes in effective refractive index and/or change in optical phase. In one example, the semiconductor device 730 may be implemented as a resistor element, for example, embodied by the waveguide 402 connected to anode 206 and silicon device layer 410, as described above in connection with FIG. 4. In another example, the semiconductor device 730 may be implemented as a PIN junction diode element, for example, embodied by the waveguide 502 connected between anode 206 and silicon device layer 510, as described above in connection with FIG. 5. In another example, the semiconductor device 730 may be implemented as a PN junction diode element, for example, embodied by waveguide 602 between anode 206 and the cathode 640, as described above in connection with FIG. 6.

The light-emitting portion 710 may be configured to emit light, for example, laser light based on biasing a voltage applied to the light-emitting portion 710 to induce electrical states in an optical gain material. The light-emitting portion 710 may be implemented, for example, as the highly doped semiconductor layer 228, doped semiconductor layer 230, optical gain material 232, and cathode 204, as described above in connection with FIGS. 2-6.

In addition to enhancement of the modulation and phase shift of the MOSCAP ring-resonator, the examples herein may also provide for a wider range and more complex functionality of tuning capabilities. For example, employing phase shift and modulation though separate electrical contacts (e.g., applying voltage bias between electrode 220 and electrode 222, while simultaneously applying a bias between electrode 234 and electrode 222), the implementations herein can obtain not only a non-return-to-zero (NRZ) modulation with larger optical modulation amplitude (OMA) with two synchronous NRZ electrical signals, but also a pulse amplitude modulation (e.g., PAM4) with two separate NRZ electrical signals. For example, independently biasing voltages applied to each pair of electrode contacts allows for separate modulation. As an illustrative example, the MOSCAP 720 and semiconductor device 730 may be independently biased so to induce varying modulations of phase shifting properties. Furthermore, biasing of the light-emitting portion 710 may permit modulation of the amplitude of the output light along with the modulation of the phase shift. As an illustrative example, by biasing the voltage across electrodes 226 and 220 of the light-emitting portion 710 to induce an amplitude modulation of the light (e.g., varying light intensity), while also biasing the MOSCAP 720 and semiconductor device 730 to induce a phase shift modulation. Accordingly, PAM4 modulation may be achieved through the examples described in connection with FIGS. 2-6.

Figure 8:
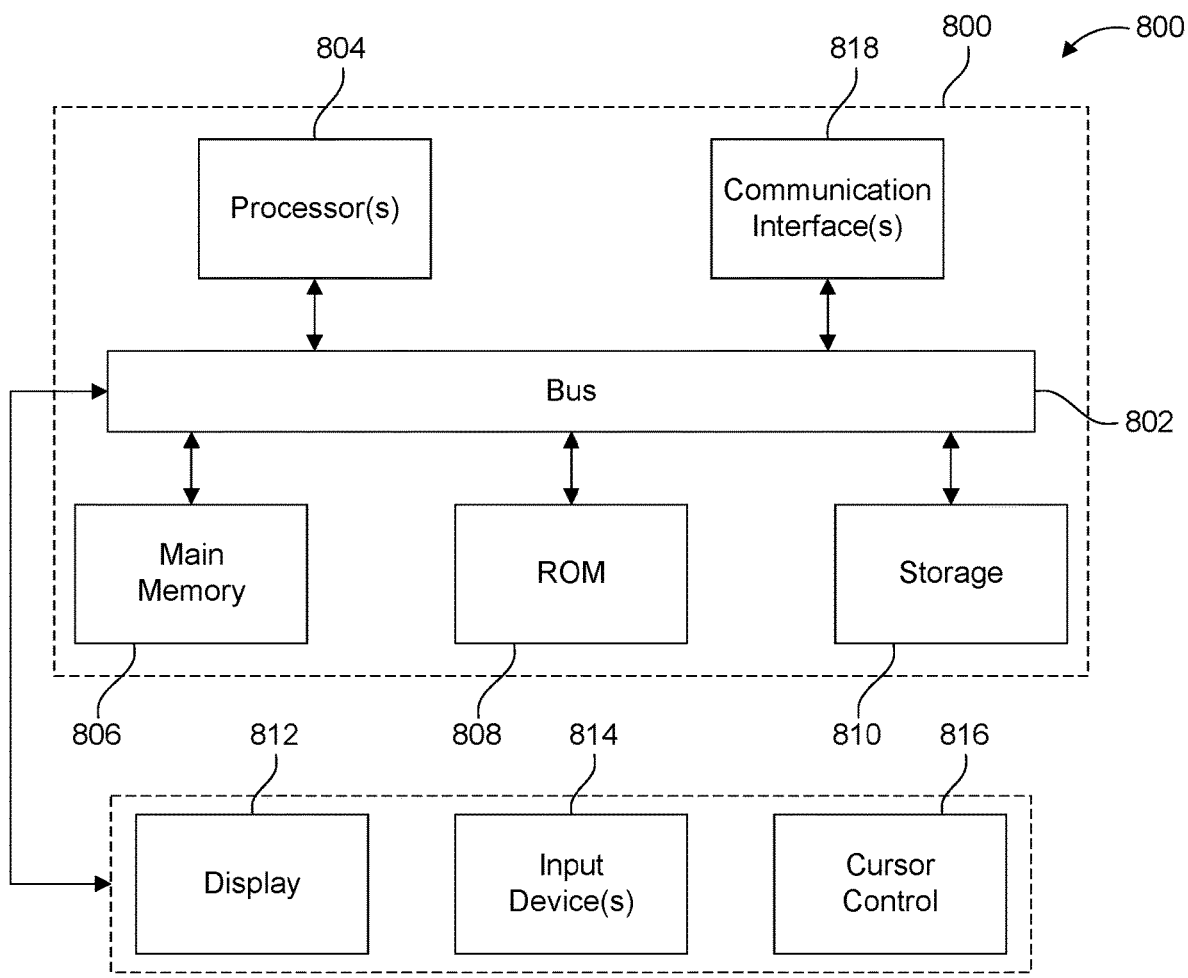
FIG. 8 is an example computer system that may be used to implement various features of the various optical devices of the present disclosure.

FIG. 8 depicts a block diagram of an example computer system 800 in which various of the embodiments described herein may be implemented. The computer system 800 includes a bus 802 or other communication mechanism for communicating information, one or more hardware processors 804 coupled with bus 802 for processing information. Hardware processor(s) 804 may be, for example, one or more general purpose microprocessors. As described above, computer system 800 may be implemented for controlling the power sources described above (e.g., one or more of power sources 450, 460, 550, 560, 650, and 660).

The computer system 800 also includes a main memory 806, such as a random-access memory (RAM), cache and/or other dynamic storage devices, coupled to bus 802 for storing information and instructions to be executed by processor 804. Main memory 806 also may be used for storing temporary variables or other intermediate information during execution of instructions to be executed by processor 804. Such instructions, when stored in storage media accessible to processor 804, render computer system 800 into a special-purpose machine that is customized to perform the operations specified in the instructions.

The computer system 800 further includes a read only memory (ROM) 808 or other static storage device coupled to bus 802 for storing static information and instructions for processor 804. A storage device 810, such as a magnetic disk, optical disk, or USB thumb drive (Flash drive), etc., is provided and coupled to bus 802 for storing information and instructions.

The computer system 800 may be coupled via bus 802 to a display 812, such as a liquid crystal display (LCD) (or touch screen), for displaying information to a computer user. An input device 814, including alphanumeric and other keys, is coupled to bus 802 for communicating information and command selections to processor 804. Another type of user input device is cursor control 816, such as a mouse, a trackball, or cursor direction keys for communicating direction information and command selections to processor 804 and for controlling cursor movement on display 812. In some embodiments, the same direction information and command selections as cursor control may be implemented via receiving touches on a touch screen without a cursor.

The computing system 800 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 800 may implement the techniques described herein using customized hard-wired logic, one or more ASICs or FPGAs, firmware and/or program logic which in combination with the computer system causes or programs computer system 800 to be a special-purpose machine. According to one embodiment, the techniques herein are performed by computer system 800 in response to processor(s) 804 executing one or more sequences of one or more instructions contained in main memory 806. Such instructions may be read into main memory 806 from another storage medium, such as storage device 810. Execution of the sequences of instructions contained in main memory 806 causes processor(s) 804 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 810. Volatile media includes dynamic memory, such as main memory 806. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 802. Transmission media can also take the form of acoustic or light waves, such as those generated during radio-wave and infra-red data communications.

The computer system 800 also includes a communication interface 818 coupled to bus 802. Communication interface 818 provides a two-way data communication coupling to one or more network links that are connected to one or more local networks. For example, communication interface 818 may be an integrated services digital network (ISDN) card, cable modem, satellite modem, or a modem to provide a data communication connection to a corresponding type of telephone line. As another example, network interface 818 may be a local area network (LAN) card to provide a data communication connection to a compatible LAN (or WAN component to communicated with a WAN). Wireless links may also be implemented. In any such implementation, communication interface 818 sends and receives electrical, electromagnetic or optical signals that carry digital data streams representing various types of information. Communication interface 818 may be communicatively coupled to one or more power sources (e.g., one or more of power sources 450, 460, 550, 560, 650, and 660 of FIGS. 4-6).

A network link typically provides data communication through one or more networks to other data devices. For example, a network link may provide a connection through local network to a host computer or to data equipment operated by an Internet Service Provider (ISP). The ISP in turn provides data communication services through the worldwide packet data communication network now commonly referred to as the "Internet." Local network and Internet both use electrical, electromagnetic or optical signals that carry digital data streams. The signals through the various networks and the signals on network link and through communication interface 818, which carry the digital data to and from computer system 800, are example forms of transmission media.

The computer system 800 can send messages and receive data, including program code, through the network(s), network link and communication interface 818. In the Internet example, a server might transmit a requested code for an application program through the Internet, the ISP, the local network and the communication interface 818.

The received code may be executed by processor 804 as it is received, and/or stored in storage device 810, or other non-volatile storage for later execution. Accordingly, the computer system 800 may be configured to control voltage bias applied between contact electrodes by sending instructions to one or more power sources according to instructions stored in main memory 806 and/or ROM 808 over communication interface(s) 818.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 800.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. An optical device comprising:
    a substrate;
    a heterogeneous metal oxide semiconductor (MOS) capacitor formed on the substrate, the MOS capacitor comprising:
        an optical waveguide;
        a first cathode comprising a first material and formed in the optical waveguide;
        an anode formed in the optical waveguide, the anode comprising a second material different from the first material; and
        a dielectric disposed between the first cathode and the anode, the dielectric comprising an oxide of the first material and an oxide of the second material, wherein the heterogeneous MOS capacitor is defined between the anode and the first cathode; and
        a semiconductor device layer disposed between the substrate and the heterogeneous MOS capacitor and formed in the optical waveguide.

2. The optical device of claim 1, further comprising a light-emitting diode disposed on the heterogeneous MOS capacitor opposite the substrate.

3. The optical device of claim 2, wherein the light-emitting diode comprises an optical gain material formed on the first cathode opposite the dielectric.

4. The optical device of claim 1, wherein the optical device comprises a micro-ring shape.

5. The optical device of claim 1, wherein the semiconductor device layer and the anode define a resistor element formed in the optical waveguide.

6. The optical device of claim 5, wherein the semiconductor device layer comprises a second cathode comprising a third material and formed in the optical waveguide, wherein the anode and the second cathode each comprise dopants of the same polarity, and wherein the optical waveguide is intrinsically doped.

7. The optical device of claim 1, wherein the optical waveguide comprises a first region and a second region that define a p-n junction diode formed in the optical waveguide.

8. The optical device of claim 7, wherein the semiconductor device layer comprises a second cathode comprising a third material and formed in the optical waveguide, wherein the anode and the second cathode each comprise dopants of opposite polarity, and wherein the first region comprises dopants of the same polarity as the anode and the second region comprises dopants of the same polarity as the second cathode.

9. The optical device of claim 1, wherein the semiconductor device layer comprises a third material charged oppositely from the anode, wherein the semiconductor device layer, optical waveguide, and the anode define a PIN junction diode.

10. The optical device of claim 9, wherein the semiconductor device layer comprises a second cathode comprising a third material and formed in the optical waveguide, wherein the anode and the second cathode each comprise dopants of opposite polarity, and wherein the optical waveguide is intrinsically doped.

11. The optical device of claim 1, wherein the first material comprises a Group III-V material.

12. The optical device of claim 1, wherein the second material comprises a Group IV material.

13. The optical device of claim 1, wherein the semiconductor device layer comprises a Group IV material.

14. A micro-ring laser comprising:
    a hybrid metal oxide semiconductor (MOS) capacitor formed on a substrate, the hybrid MOS capacitor comprising:
        an optical waveguide;
        a first cathode comprising a Group III-V material and formed in the optical waveguide;
        an anode formed in the optical waveguide, the anode comprising a Group IV material;
        and a dielectric disposed between the first cathode and the anode, the dielectric comprises an oxide of the Group III-V material and an oxide of the Group V material, wherein the hybrid MOS capacitor is defined between the anode and the first cathode;
        a second cathode comprising a Group IV material disposed between the substrate and the first cathode on a side of the optical waveguide opposite the anode, the second cathode formed in the optical waveguide and configured to integrate one of a resistor element, a p-n junction diode element, and a PIN junction diode element into the optical waveguide; and
        a light-emitting portion comprising an optical gain material, the light-emitting portion disposed on the first cathode opposite the substrate.

* * * * *